United States Patent [19]

Lehto et al.

[11] 4,228,354

[45] Oct. 14, 1980

[54] METHOD FOR DETECTING RADIATION

[76] Inventors: Ari Lehto, Läksyrinne 27-29 E 2, Helsinki 75; Hannu Harjunmaa, Aallonhuippu 7 B 35, Espoo 32, both of Finland

[21] Appl. No.: 57,216

[22] Filed: Jul. 13, 1979

[51] Int. Cl.² .............................................. G01T 1/22
[52] U.S. Cl. ..................................................... 250/371
[58] Field of Search ............... 250/338, 340, 370, 371; 357/30; 307/309

[56] References Cited

U.S. PATENT DOCUMENTS

| | | | |
|---|---|---|---|
| 2,991,366 | 7/1961 | Salzberg | 250/370 |
| 3,430,043 | 2/1969 | Blumenfeld et al. | 250/371 |
| 4,045,674 | 8/1977 | Vermeulen | 250/371 |

FOREIGN PATENT DOCUMENTS 589927  12/1959  Canada ....................................... 250/371

*Primary Examiner*—Alfred E. Smith
*Assistant Examiner*—Janice A. Howell
*Attorney, Agent, or Firm*—J. Harold Nissen

[57] ABSTRACT

A method for detecting and measuring electromagnetic or particle radiation by electrical means has been provided. A piece of semiconductor material, such as phosphorus-doped silicon, fitted with at least two electrodes is used as the detector and the measurement is performed by exposing the detector to the radiation to be measured and by applying an electric field between the electrodes, which will cause an electric breakdown after a certain delay time. The length of this delay time preceding the breakdown is altered by radiation and the magnitude of the change is serving as a measure of the intensity of the radiation falling on the detector.

6 Claims, No Drawings

METHOD FOR DETECTING RADIATION

The present invention relates generally to detecting and measuring electromagnetic or particle radiation. Several electronic components capable of detecting radiation are known in the art. However, the measurement of small radiative powers is made difficult by the fact that the electric signal obtained thereby is small, necessitating the use of a low-noise preamplifier.

An object of the present invention is to provide an improved method for detecting electromagnetic or particle radiation, in which the above-mentioned drawback is avoided. In accordance with the invention radiation is detected and measured by exposing a piece of semiconductor fitted with two or more electrodes to the radiation to be measured, applying an electric field between electrodes and observing the delay from the application of the electric field to the subsequent electric breakdown, the radiation-induced change in the delay serving as a measure of the intensity of the radiation to be measured. The piece of semiconductor forming the detector in this method is called a photochronic detector. Its output is a voltage pulse, the amplitude of which does not depend on the intensity of the radiation detected; however, its length depends on it.

A photochronic detector is a piece of semiconductor with two or more electric contacts attached onto it. When a voltage is applied between the electrodes, appreciable electric current will not flow immediately, but only after a subsequent breakdown occurs. The breakdown itself is a very abrupt phenomenon. The time interval from the application of the voltage to the breakdown is called the breakdown delay. Radiation affects the photochronic detector by altering the length of the breakdown delay. It can either shorten or lengthen it, depending of the energy of the radiation quanta.

The temperature of the semiconductor must be low enough, not higher than 25° K. for materials investigated so far. In principle, it is possible to prepare a photochronic detector that functions at room temperature, if a suitable material is found. The fact that the present photochronic detector requires a low temperature to be functional is not a unique handicap, because, depending on the energy range of the radiation to be measured, many of the existing photon and particle detectors must be refrigerated.

One of the advantages of the photochronic detector is that even with a small incident radiative power the signal given by the detector remains unchanged in amplitude. Only the length of the output pulse varies. A preamplifier is therefore unnecessary, and the photochronic detector can be directly coupled to a digital electronic system.

Another advantage of the photochronic detector is that its dynamic range can be varied by changing the voltage used to effect the breakdown.

The photochronic detector is an integrating detector, i.e. a longer exposure time will give a larger signal.

The photochronic detector is prepared from a suitable n- or p-type impurity semiconductor. Its conductivity must be small enough for the breakdown to be possible.

One of the materials suitable for preparing a photochronic detector is phosphorus-doped silicon. The operation of a photochronic detector made from it is described below. This detector is sensitive to middle infrared radiation. Among the other semiconductor materials that may be used for the detector are boron-doped silicon, arsenic-doped silicon as well as similar materials, in which silicon has been replaced by germanium.

The photochronic detector of this example is prepared from a single crystal. A photochronic detector could also be prepared from a polycrystalline substance. The geometrical form of the photochronic detector affects its sensitivity because of the influence it has on the concentration of the radiation in the breakdown region. Thus the detector may have e.g. the shape of a plate of about equal thickness or, preferably, the shape of a convex lens. The form is, however, irrelevant to the principle of operation of the detector.

This photochronic detector is fitted with two ohmic (not-rectifying) contacts. The ohmicity is advantageous, but not necessary for the operation of the device.

The photochronic detector is used in the following way: First, it is exposed to the radiation to be measured. An electric voltage is applied between the contacts, giving rise to an electric field $\epsilon$. within the semiconductor. In this particular case, $\epsilon$. is in the range 200 ... 2000 V/cm. $\epsilon$. must exceed a certain minimum value for the breakdown to occur. The minimum value depends on the temperature and the level of doping of the semiconductor; with other materials it may be smaller than the value 200 V/cm cited here. The operation temperature of the photochronic detector of this example is 9° K. The time interval from the application of the voltage to the breakdown is measured. The breakdown manifests itself with a sudden decrease in the electrical resistance of the semiconductor. Another measurement is made with the device protected from the radiation to be measured. The difference of the time intervals, or the breakdown delays, is a measure of the radiative power. The breakdown delay is generally of the order of milliseconds and increases with decreasing $\epsilon$. . If the incident radiation is of a wavelength long enough, the breakdown delay increases compared to the situation where the detector is protected from it. If the incident radiation is of a short wavelength, like visible light, the delay decreases. A moderate radiative power ($10^{-7}$W for example) of infrared radiation is sufficient to lengthen the breakdown delay to a value several hundred times the value obtained when the detector is protected from the radiation. Therefore, in many cases it is not necessary to measure the latter delay at all. The measurement of the delay can be repeated with a time interval of a few seconds, but considerably shorter (of the order of milliseconds) or longer (of the order of minutes) intervals can also be used. The change in the delay increases with increasing time interval between the measurements due to the integrating property of the photochronic detector.

The length of the breakdown delay depends on the population of the excited donor states near the conduction band in an n-type semiconductor and on the population of the excited acceptor states near the valence band in a p-type semiconductor. The principle of operation of a photochronic detector made of an n-type semiconductor, such as phosphorus-doped silicon, is described below.

The more there are electrons on the long-lived excited states near the conduction band, the shorter is the breakdown delay, because the small current flowing in the semiconductor after the application of $\epsilon$. but before the breakdown is able to promote them to the conduction band by means of impact ionisation considerably more easily than it is able to promote electrons on the lower states. The new free electrons consequently generate still more free electrons by impact ionisation, and at the end of the breakdown delay an avalanche breakdown occurs. Long-wavelength radiation decreases the population of the excited states near the conduction band by returning electrons via shorter-lived states or the conduction band to the ground state. Short-wavelength radiation increases the population of the excited states near the conduction band by promoting electrons to them from the ground states of the impurity atoms or from the valence band. If the photochronic detector is exposed to both short- and long-wavelength radiation, the former increases and the latter decreases the populations pertinent to the breakdown delay, and the delay is a measure of the difference of the radiation quantum intensities.

The sensitivity of the photochronic detector can be increased by decreasing the populations of the excited states with a voltage of insufficient magnitude to cause a breakdown. The voltage can be applied to the detector during the whole exposure time or during only part of it. The sensitivity of the photochronic detector can also be increased by placing it in a magnetic field. This causes the impurity excited states to split into several substates because of the Zeeman effect, offering smaller energy differences for longer wavelength radiation to excite electrons over.

The populations of the impurity excited states can be increased by exposing the detector to short-wavelength radiation other than that being measured. This makes the measurement of intense long-wavelength radiation possible.

The sensitivity of the photochronic detector when measuring long-wavelength radiation can be further increased by cutting off the radiation immediately before the application of the voltage used to effect breakdown. The breakdown delay then experiences an increase due to the depletion of the shorter-lived higher excited states, which affect the delay most. Similarly, when measuring the breakdown delay with the detector or not exposed to the radiation to be measured, the radiation can be allowed to fall onto it for a short time immediately before the measurement is made. This shortens the delay due to the inverse effect. The short time immediately before the measurement of the delay is in both cases of the order of tens of milliseconds for phosphorus-doped silicon at a temperature of 9° K.

What we claim is:

1. In the method for detecting electromagnetic or particle radiation which comprises exposing a piece of semiconductor fitted with two or more electrodes to the radiation to be measured, applying an electric field between electrodes and observing the delay from the application of the electric field to the subsequent electric breakdown, the radiation-induced change in the delay serving as a measure of the intensity of the radiation to be measured.

2. The method according to claim 1, in which an electric field of a magnitude insufficient to cause a breakdown is applied to the semiconductor during the time between the measurements of the breakdown delays.

3. The method according to claim 1, in which the semiconductor is placed in a magnetic field.

4. The method according to claim 1, in which the semiconductor is exposed simultaneously to radiation of a shorter wavelength than that to be measured.

5. The method according to claim 1, in which the radiation is interrupted immediately before the electric field is applied, when measuring the response of the detector exposed to the radiation, or the detector is exposed to the radiation for a short time immediately before the electric field is applied, when measuring the response of the unilluminated detector.

6. The method according to claim 1, in which the detector is exposed to two radiations of different wavelengths, the change in the breakdown delay serving as a measure of the difference of the quantum intensities of the radiations.

* * * * *